United States Patent [19]

Carlson

[11] 4,217,148
[45] Aug. 12, 1980

[54] COMPENSATED AMORPHOUS SILICON SOLAR CELL

[75] Inventor: David E. Carlson, Yardley, Pa.

[73] Assignee: RCA Corporation, New York, N.Y.

[21] Appl. No.: 49,496

[22] Filed: Jun. 18, 1979

[51] Int. Cl.² .................... H01L 31/06; B05D 3/06
[52] U.S. Cl. .................... 136/89 SJ; 136/89 TF; 357/2; 357/15; 357/30; 427/39
[58] Field of Search .................... 136/89 SJ, 89 TF; 357/2, 15, 30; 427/38–40, 74

[56] References Cited

U.S. PATENT DOCUMENTS

| 4,064,521 | 12/1977 | Carlson ........................ 357/2 |
| 4,084,043 | 4/1978 | Witzke et al. ............... 429/111 |
| 4,085,257 | 4/1978 | Witzke ........................ 429/111 |
| 4,142,195 | 2/1979 | Carlson et al. ............... 357/15 |
| 4,152,490 | 5/1979 | Witzke ........................ 429/111 |

OTHER PUBLICATIONS

W. E. Spear et al., "Electronic Properties of Substitutionally Doped Amorphous Si and Ge", *Phil. Mag.*, vol. 33, pp. 935–949 (1976).

C. R. Wronski, "The Dependence of Solar Cell Characteristics on the Electronic Properties of Discharge Produced, Hydrogenated Amorphous Silicon", *Conf. Record, 13th IEEE Photovoltaic Specialists Conf.*, Jun. 1978, pp. 744–750.

*Primary Examiner*—Aaron Weisstuch
*Attorney, Agent, or Firm*—Birgit E. Morris; A. Stephen Zavell

[57] ABSTRACT

An amorphous silicon solar cell incorporates a region of intrinsic hydrogenated amorphous silicon fabricated by a glow discharge wherein said intrinsic region is compensated by P-type dopants in an amount sufficient to reduce the space charge density of said region under illumination to about zero.

16 Claims, 2 Drawing Figures

COMPENSATED AMORPHOUS SILICON SOLAR CELL

The government of the United States of America has rights in this invention pursuant to Department of Energy Contract No. EY-76-C-03-1286.

The present invention relates to amorphous silicon solar cells. More particularly, the invention relates to amorphous silicon solar cells which incorporate an intrinsic region of hydrogenated amorphous silicon.

BACKGROUND OF THE INVENTION

Photovoltaic devices, i.e., solar cells, are capable of converting solar radiation into usable electrical energy. The energy conversion occurs as the result of what is known as the photovoltaic effect. Solar radiation impinging on a solar cell and absorbed by an active region of semiconductor material generates electrons and holes. Electrons and holes are separated by a built-in electric field in the solar cell, such as a rectifying junction. The separation of electrons and holes by the rectifying junction results in the generation of an electric current known as the photocurrent and a voltage known as the photo-voltage. The electrons flow toward the region of semi-conductor material having N-type conductivity, and the holes flow toward a region of semiconductor material of opposite conductivity or a metal layer.

Basic types of hydrogenated amorphous silicon solar cells incorporating an intrinsic or undoped region are disclosed in U.S. Pat. No. 4,064,521, incorporated herein by reference. Hydrogenated amorphous silicon solar cells incorporating a halogen in the undoped region are disclosed in Application Ser. No. 727,659, filed Sept. 29, 1976, also incorporated herein by reference. The undoped hydrogenated amorphous silicon of the above types is slightly N-type when fabricated at an optimum substrate temperature of from about 250° C. to about 350° C. The slightly N-type nature of the undoped film under illumination implies a donor-like defect in the intrinsic hydrogenated amorphous silicon region. The space charge region of an amorphous silicon solar cell incorporating an undoped region could be increased if said region were not slightly N-type. Thus, it would be highly desirable to have an hydrogenated amorphous silicon solar cell with an increased width of the space charge layer under illumination and an undoped region which was not slightly N-type, but more nearly zero or substantially neutral under illumination.

SUMMARY OF THE INVENTION

An improved hydrogenated amorphous silicon solar cell incorporates a compensated region of intrinsic hydrogenated amorphous silicon. The intrinsic region incorporates suitable P-type dopants in amounts to compensate the donor-like defects which occur during fabricating. The compensation increases the space charge layer of the solar cell under illumination. The invention further embodies a method of obtaining the improved solar cell.

DETAILED DESCRIPTION OF THE INVENTION

Figure 1:
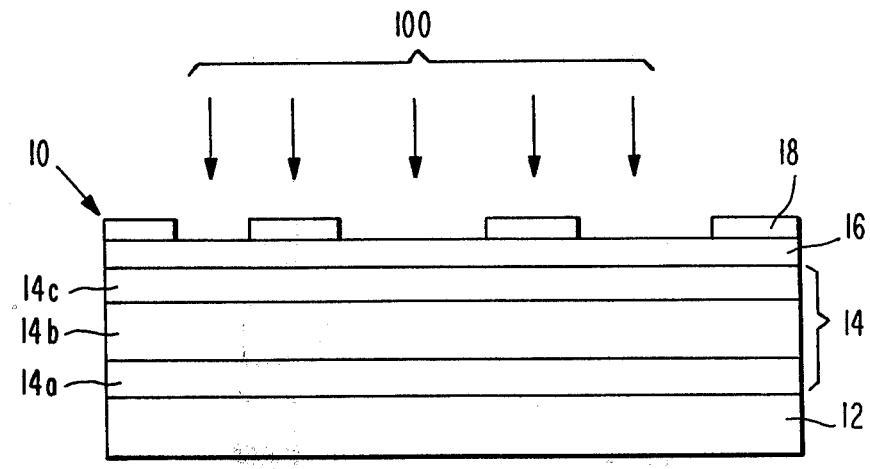
FIG. 1 illustrates a P-I-N hydrogenated amorphous silicon solar cell incorporating a compensated intrinsic region.

The invention will be more clearly illustrated by referring to FIG. 1 which depicts a P-I-N solar cell designated as 10, hereinafter solar cell 10. Solar radiation 100, impinging on solar cell 10, forms a reference point for the incident surface of each layer or region of the solar cell. The solar cell 10 includes an electrically conductive substrate 12 of stainless steel, molybdenum, titanium, or other suitable materials. Optionally, substrate 12 may be glass coated with an electrically conductive material such as a transparent conductive oxide, hereinafter referred to as TCO, such an tin oxide, indium tin oxide, or like material.

The active layer of hydrogenated amorphous silicon 14 is deposited upon substrate 12 in a glow discharge. The active layer 14 has regions 14a, 14b, and 14c of differing conductivity type. The region 14a, contiguous to and deposited upon substrate 12, is doped $N_+$-type. The device may be fabricated without region 14a but the $N^+$-type region 14a assures an ohmic contact to the conductive substrate 12. The region 14a may have a thickness of up to about 1,000 nanometers if the substrate 12 has a rough surface, although, preferably, the thickness is on the order of from about 10 to about 50 nanometers.

The region 14b of compensated intrinsic hydrogenated amorphous silicon is contiguous to region 14a. The compensated intrinsic hydrogenated amorphous silicon region 14b is fabricated by a glow discharge with P-type conductivity modifiers of sufficient concentration to provide a neutral or substantially neutral space charge region under illumination. The P-type dopants compensate the donor defects in the undoped hydrogenated amorphous silicon and increase the space charge width of the solar cell. Under illumination, the P-type dopant may also help to compensate trapped holes. In undoped hydrogenated amorphous silicon, the trapping of holes under illumination adds to the space charge and decreases the space charge layer. Compensating the intrinsic region 14b provides a larger space charge region between said region and region 14a. The compensation of region 14b enables a device with an intrinsic region of up to about 1000 nanometers as opposed to the present optimum structure with an intrinsic region of from about 200 nanometers to about 300 nanometers. Preferably region 14b is from about 500 to 1000 nanometers thick.

A region 14c of P-type hydrogenated amorphous silicon is contiguous to the improved region 14b. Region 14c is an hydrogenated amorphous silicon layer doped with P-type conductivity modifiers such as boron, aluminum, gallium, or indium, or other suitable P-type dopants. Said region is from about 10 to about 50 nanometers thick.

A transparent conductive oxide, TCO, is deposited on the active layer of hydrogenated amorphous silicon. The TCO layer 16 should be transparent to solar radiation, form an integral antireflection coating, and preferably have a series resistance of less than about 10 ohms/square.

A grid electrode 18 is deposited on the TCO layer 16. The grid electrode withdraws the current generated during the illumination of solar cell 10. The grid electrode can be platinum, gold, or other suitable material. As the size, i.e., area, of the solar cell decreases, the need for the grid electrode 18 diminishes and the integral antireflection coating and TCO layer 16 may be sufficient to withdraw the current generated during illumination of the solar cell without introducing excessive series resistance into the solar cell structure. In a modification of this embodiment, a high work function metal is interposed between region 14c of P-type hydrogenated amorphous silicon and TCO layer 16.

Figure 2:
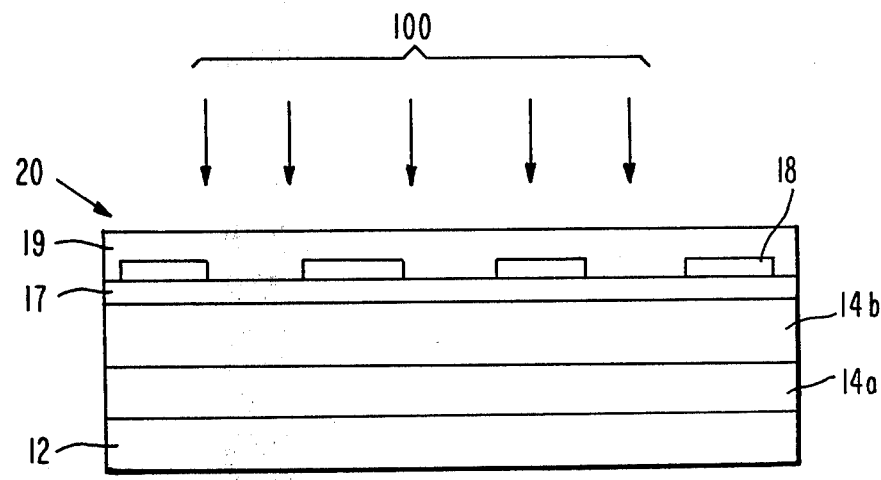
FIG. 2 illustrates a Schottky barrier hydrogenated amorphous silicon solar cell with a compensated intrinsic region.

An alternative embodiment of the invention is illustrated in FIG. 2. Solar cell 20 has the same substrate 12, regions 14a and 14b, and grid electrode 18 as solar cell 10 of FIG. 1. However, solar cell 20 incorporates a metal layer 17 forming a Schottky barrier to the compensated region 14b and an antireflection coating 19 of TiO$_2$ or like material which are not transparent conductive oxides. In solar cell 20, the photocurrent generated during illumination is collected and withdrawn by the substrate 12, layer 17, and the grid electrode 18.

The width of the space charge region is increased by compensating the undoped (slightly N-type) region in accordance with the following formula:

$$W = \left[ \frac{2\epsilon_S}{qN_S} \left( V_{bi} - V - \frac{kT}{q} \right) \right]^{\frac{1}{2}}$$

where $N_S$ is the space charge density and $\epsilon_S$ is the dielectric constant, $V_{bi}$ is the built-in potential, V is applied voltage, T is temperature, k is Boltzmann's constant, and q is charge. Compensating the undoped region decreases $N_S$ and thus with the other variables remaining constant, W increases, i.e., the width of the space charge layer.

As an illustration, for an intrinsic material with one donor state, $N_S = N_D$ (donor charge density). $N_S$ is reduced by incorporating acceptor states ($N_A$) into the region because $N_S = N_D - N_A$. Alternatively, W can be increased by increasing $V_{bi}$. Increasing W increases the collection region, which improves the short current density ($J_{sc}$) and the fill factor (FF).

In hydrogenated amorphous silicon, $N_S$ under illumination must be minimized. Additional acceptor states are necessary to compensate trapped holes in the material. Balancing the donor-like defects and the trapped holes to minimize $N_S$, ideally $N_S = 0$, increases the efficiency $\eta$ of the solar cell.

Solar cell 10 may be fabricated in a glow discharge atmosphere by several methods. The discharge can be either RF discharge, AC proximity discharge, DC cathodic discharge, or DC proximity discharge. A DC proximity discharge is defined to mean a discharge where the substrate is located near or in the proximity of a cathode screen electrode. The negative terminal of the power source is connected to a screen cathode and the positive terminal of the power source is connected to a separate electrode which functions as the anode. Suitable conditions for DC or AC proximity discharge are temperatures of from about 200° C. to about 350° C., pressures of from about 0.20 Torr to about 0.75 Torr, and a current density of from about 0.20 to about 0.8 mA/cm$^2$.

The preferred temperature range for DC proximity discharge, DC cathodic discharge, and AC proximity discharge is from about 250° C. to about 350° C. Recent work indicates that a preferred temperature range for RF power discharge is from about 200° C. to about 300° C. Although the optimum temperature for the preparation of the layer of hydrogenated amorphous silicon varies depending upon the power source, undoped hydrogenated amorphous silicon films prepared at the optimum temperature for a given discharge all exhibit a slightly N-type conductivity.

For illustrative purposes, the fabrication procedure will be described with a DC proximity discharge system. The substrate is placed in a DC proximity glow discharge apparatus and heated to from about 250° C. to about 350° C. With the pressure reduced in the ranges previously set forth, silane, or a silicon halogen hydrogen containing-compound and a suitable N-type dopant source, such as phosphine, is introduced in the glow discharge atmosphere to deposit the N+-type region.

After the deposition of the N+-type region 14a, the doping gas is pumped or flushed out of the system, and the deposition is continued in a silicon hydrogen-containing atmosphere to deposit a region of intrinsic hydrogenated amorphous silicon. The N-type conductivity of the undoped hydrogenated amorphous silicon is compensated through the addition of $B_2H_6$ or other suitable P-type dopants in the range of from about 0.00001 to about 0.003 percent $B_2H_6$ of the $B_2H_6$/silicon hydrogen or silicon halogen hydrogen-containing atmosphere. The doping ranges incorporated in the compensated intrinsic region result in an intrinsic region incorporating boron in a concentration of about $4 \times 10^{15}$ atoms per cubic centimeter to about $1.2 \times 10^{18}$ boron atoms per cubic centimeter. Of this boron concentration, about 30 percent of the boron atoms are electronically active. As the electronic activity of the boron incorporated in the intrinsic region increases, the concentration of boron required to compensate the region decreases. In addition, as the trapping of photogenerated holes decreases, the concentration of boron required to compensate the illuminated region decreases.

The actual boron concentration incorporated during the deposition of the compensated intrinsic hydrogenated amorphous silicon region should be adjusted so that the depletion width is maximized under air mass 1 (AM1) illumination and the space charge density is at a minimum under illumination.

The compensation of the slightly N-type material with a P-type acceptor minimizes the space charge density of the intrinsic hydrogenated amorphous silicon region. The compensation of the undoped region with low amounts of P-type dopants avoids degradation of the photovoltaic properties of hydrogenated amorphous silicon through the significant reduction in the recombination lifetime experienced in more highly doped P-type hydrogenated amorphous silicon.

The thickness of the compensated region should be roughly equal to the width of the space charge region under AM 1 sunlight conditions, or from about 300 to about 1,000 nanometers. In a P-I-N cell, both the P-I and the I-N junctions will have comparable built-in potentials, so a junction with the compensated intrinsic region assures that the electric field extends through the intrinsic region. In this type of compensated P-I-N cell, light may be incident on either the P or the N layer, but in any case the layer must be thin to avoid recombination losses due to absorption in the P or N layer.

After deposition of the compensated intrinsic hydrogenated amorphous silicon layer, the P-type conductivity modifier concentration is increased to from about 0.01 to about 1 percent of the silane or halogen-containing silicon compound atmosphere. Preferably, the P-type conductivity modifier concentration is about 0.10 percent by volume of the glow discharge atmosphere. Said P-type dopant concentration will result in a P-type region with a dopant concentration of from about $4 \times 10^{18}$ to about $4 \times 10^{20}$ P-type dopant atoms per cubic centimeter. Optionally, the P-type or N-type regions may be graded over distances of from about 10 to about 100 or 200 nanometers to develop a better field distribution in the solar cell and reduce recombination in the P-type and N-type regions.

The thickness of the P-type region should have a thickness of from about 5 nanometers to about 100 nanometers. Preferably, the P-type region has a thickness of from about 10 to about 50 nanometers. The thicker the P-type region and the higher concentration of P-type dopants contained therein, the more strongly the incident solar radiation is absorbed therein, thus reducing the available sunlight to convert into electric current in the intrinsic region.

After the deposition of the hydrogenated amorphous silicon layer, a TCO layer is evaporated onto the hydrogenated amorphous silicon layer and then a grid electrode is evaporated onto the TCO layer by methods known in the art, such as evaporation and like methods. Alternatively, a contact electrode of gold, platinum, or other suitable materials is deposited on the hydrogenated amorphous silicon layer by electron beam evaporation or other suitable methods. Thereafter, a grid electrode and antireflection coating are deposited on the contact electrode.

Although the fabrication has been illustrated for a P-I-N hydrogenated amorphous silicon solar cell, the compensated region of intrinsic hydrogenated amorphous silicon can also be incorporated into Schottky barrier and heterojunction devices or similar semiconductor devices incorporating an intrinsic region. The invention will be further illustrated by the following Examples, but it is to be understood that the invention is not meant to be limited solely to the details described therein. Modifications which would be obvious to one of ordinary skill in the solar cell art are contemplated to be within the scope of the invention.

EXAMPLE I

A molybdenum substrate about 1 millimeter thick was placed in a DC cathodic discharge and heated to about 300° C. A region of N+-type hydrogenated amorphous silicon about 100 nanometers thick was deposited on the substrate by a glow discharge of silane and PH$_3$. The silane to PH$_3$ ratio was about $2 \times 10^3$:1. Thereafter, a compensated region of hydrogenated amorphous silicon about 1,000 nanometers thick was deposited on the N+-type region using a silane to B$_2$H$_6$ ratio of about $3 \times 10^6$:1. The hydrogenated amorphous silicon layer was completed by depositing a region of P-type hydrogenated amorphous silicon about 30 nanometers thick on the intrinsic region. The silane to B$_2$H$_6$ ratio employed was about $5 \times 10^4$:1. Finally, about 5 nanometers of platinum followed by about 40 nanometers of TiO$_2$ were evaporated on the layer of hydrogenated amorphous silicon.

EXAMPLE II

A solar cell similar to Example I was fabricated, except the intrinsic region was fabricated using a silane to boron ratio of about $1 \times 10^5$:1.

CONTROL

A solar cell similar to Examples I and II was fabricated but with an undoped intrinsic region.

The results of the performance of the solar cells fabricated in Examples I, II, and the Control are tabulated below in Table I. The open circuit voltage, $V_{oc}$, and short circuit current, $J_{sc}$, were measured under AM1 illumination. The efficiency $\eta(\%)$ was calculated from the $J_{sc}$ and $V_{oc}$.

TABLE 1

| EXAMPLE | $V_{oc}$ | $J_{sc}$ | $\eta$ (%) |
|---|---|---|---|
| Control I | 710 | 3.0 | 0.51 |
| Example I | 710 | 8.0 | 1.50 |
| Example II | 655 | 5.0 | 0.90 |

The table illustrates the increased $J_{sc}$ and efficiency of the compensated solar cells over a standard undoped intrinsic hydrogenated amorphous silicon solar cell.

What is claimed is:

1. In an amorphous silicon solar cell which comprises an electrically conductive substrate, a layer of glow discharge deposited hydrogenated amorphous silicon having regions of differing conductivity with at least one region of intrinsic hydrogenated amorphous silicon, said layer of hydrogenated amorphous silicon having opposed first and second major surfaces where said first major surface contacts said electrically conductive substrate, and means for electrically contacting said second major surface, the improvement wherein the intrinsic hydrogenated amorphous silicon region is compensated with a suitable P-type dopant in a concentration sufficient to reduce the space charge density under illumination to substantially neutral.

2. The solar cell according to claim 1 wherein the P-type dopant concentration is less than about $1.2 \times 10^{18}$ atoms per cubic centimeter in the compensated intrinsic hydrogenated amorphous silicon.

3. The solar cell according to claim 2 wherein the P-type dopant concentration of from about $4 \times 10^{15}$ is about $1.2 \times 10^{18}$ atoms per cubic centimeter of the compensated hydrogenated amorphous silicon.

4. The solar cell according to claim 1 wherein a metal layer is interposed between and contacts said second major surface of hydrogenated amorphous silicon forming a Schottky barrier thereto, and said means for electrically contacting said second major surface.

5. The solar cell according to claim 1 wherein said hydrogenated amorphous silicon layer has a region of N+-type conductivity at said first major surface which contacts said electrically conductive substrate, a region of compensated intrinsic amorphous silicon contacting said N+-type region, and a region of P-type conductivity contacting said compensated region of intrinsic hydrogenated amorphous silicon, said region of P-type conductivity being at said second major surface.

6. A solar cell according to claim 5 wherein a high work function metal layer is interposed between said P-type region and said means for electrically contacting said second major surface of hydrogenated amorphous silicon.

7. The solar cell according to claim 1 wherein said P-type dopant is incorporated into the glow discharge atmosphere during the deposition of said intrinsic region of said hydrogenated amorphous silicon layer in an amount of from about 0.00001 to about 0.003 percent of the glow discharge atmosphere.

8. The solar cell according to claim 1 wherein said compensated intrinsic hydrogenated amorphous silicon region is from about 300 to about 1,000 nanometers thick.

9. The solar cell according to claim 8 wherein the thickness of said intrinsic hydrogenated amorphous compensated region is from about 500 to about 1,000 nanometers thick.

10. A method of increasing the width of the space charge layer of an hydrogenated amorphous silicon solar cell which incorporates a region of glow discharge deposited intrinsic hydrogenated amorphous silicon comprising:

incorporating a suitable P-type dopant in said glow discharge atmosphere in an amount sufficient to reduce the illuminated space charge density of said region to substantially neutral during said glow discharge deposition of said intrinsic hydrogenated amorphous silicon region.

11. The method according to claim 10 wherein said P-type dopant is less than about 0.003 percent of the glow discharge atmosphere.

12. The method according to claim 11 wherein said P-type dopant is from about 0.00001 to about 0.003 percent of the glow discharge atmosphere.

13. The method according to claim 10 wherein the substrate temperature is from about 200° to about 350° C.

14. The method according to claim 11 wherein the glow discharge is selected from the group consisting of DC cathodic discharge, DC proximity discharge, or AC discharge.

15. The method according to claim 10 wherein the substrate temperature is from about 200° to about 300° C.

16. The method according to claim 13 wherein the glow discharge is an RF discharge.

* * * * *

UNITED STATES PATENT AND TRADEMARK OFFICE
CERTIFICATE OF CORRECTION

PATENT NO. : 4,217,148

DATED : August 12, 1980

INVENTOR(S) : David Emil Carlson

It is certified that error appears in the above-identified patent and that said Letters Patent is hereby corrected as shown below:

Column 1, line 26: "photo-voltage" should be --photovoltage--;

line 27: "semi-conductor" should be --semiconductor--;

line 23: "$N_+$" should be --N+--;

Column 6, line 41: "of" should be --is--;

"is" should be --to--.

Signed and Sealed this

Fourth Day of August 1981

[SEAL]

Attest:

GERALD J. MOSSINGHOFF

Attesting Officer

Commissioner of Patents and Trademarks